United States Patent
Satoh et al.

(10) Patent No.: US 7,839,911 B2
(45) Date of Patent: Nov. 23, 2010

(54) SEMICONDUCTOR LASER DEVICE

(75) Inventors: Tomoya Satoh, Osaka (JP); Toru Takayama, Nara (JP); Koichi Hayakawa, Okayama (JP); Isao Kidoguchi, Hyogo (JP)

(73) Assignee: Panasonic Corporation, Osaka (JP)

( * ) Notice: Subject to any disclaimer, the term of this patent is extended or adjusted under 35 U.S.C. 154(b) by 57 days.

(21) Appl. No.: 12/298,258

(22) PCT Filed: Jun. 19, 2007

(86) PCT No.: PCT/JP2007/062274

§ 371 (c)(1),
(2), (4) Date: Oct. 23, 2008

(87) PCT Pub. No.: WO2008/010374

PCT Pub. Date: Jan. 24, 2008

(65) Prior Publication Data

US 2009/0201962 A1    Aug. 13, 2009

(30) Foreign Application Priority Data

Jul. 19, 2006    (JP) .............................. 2006-196821

(51) Int. Cl.
*H01S 5/00* (2006.01)
(52) U.S. Cl. .............. 372/46.01; 372/43.01; 372/45.01; 372/49.01
(58) Field of Classification Search .............. 372/43.01, 372/45.01, 46.01, 49.01
See application file for complete search history.

(56) References Cited

U.S. PATENT DOCUMENTS 6,075,801 A * 6/2000 Tamanuki et al. ........ 372/46.01

(Continued)

FOREIGN PATENT DOCUMENTS

JP    8-23133    1/1996

(Continued)

OTHER PUBLICATIONS

Guermache, A., et al., "New Design Rules and Experimental Study of Slightly Flared 1480-nm Pump Lasers", IEEE Photonics Technology Letters, Mar. 15, 2006, vol. 18, No. 6, IEEE.

(Continued)

*Primary Examiner*—Minsun Harvey
*Assistant Examiner*—Yuanda Zhang
(74) *Attorney, Agent, or Firm*—McDermott Will & Emery LLP

(57) ABSTRACT

A semiconductor laser device 100 having a ridge stripe structure comprises: an n-type clad layer 105 having a protrusion; and an n-type current block layer 107 covering the clad layer, except the upper surface of the protrusion. When the width of the upper surface is W, the distance between front and rear cleavage planes is L, the width of the upper surface at the front cleavage plane is Wf, and the width of the upper surface at the rear cleavage is Wr. In a range where a distance from the front cleavage plane is shorter than or equal to L/2, an area Sc of the upper surface is in a range of $L/8 \times (3Wf+Wr) < Sc \leq L/2 \times Wf$, and W in an arbitrary position in the range is in a range of $\frac{1}{2}(Wf+Wr) < W \leq Wf$.

2 Claims, 6 Drawing Sheets

U.S. PATENT DOCUMENTS

| | | | |
|---|---|---|---|
| 6,104,738 A * | 8/2000 | Kitoh et al. | 372/46.01 |
| 6,301,283 B1 * | 10/2001 | Chen et al. | 372/96 |
| 6,404,790 B1 * | 6/2002 | Narui et al. | 372/43.01 |
| 6,567,446 B1 * | 5/2003 | Huang et al. | 372/46.01 |
| 6,928,097 B2 * | 8/2005 | Chida | 372/46.01 |
| 7,072,373 B2 * | 7/2006 | Ohkubo et al. | 372/46.01 |
| 7,257,139 B2 | 8/2007 | Takayama | |
| 7,301,979 B2 | 11/2007 | Ito et al. | |
| 2002/0037021 A1 * | 3/2002 | Ohkubo | 372/46 |
| 2003/0112842 A1 * | 6/2003 | Crawford | 372/46 |
| 2004/0233957 A1 | 11/2004 | Ito et al. | |
| 2005/0163181 A1 * | 7/2005 | Takayama | 372/46 |

FOREIGN PATENT DOCUMENTS

| | | |
|---|---|---|
| JP | 9-307181 | 11/1997 |
| JP | 2005-12178 | 1/2005 |
| JP | 2005-209952 | 8/2005 |
| JP | 2006-114605 | 4/2006 |

OTHER PUBLICATIONS

Nakatsuka, S., et al., "High-Power Single-Mode Flared Laser Diode with an Intermediate-Width Stripe at the Flare Base", Jpn. J. Appl. Phys., Feb. 1996, pp. 619-623, vol. 35 Part 1 No. 2A.

* cited by examiner (a)

(e)

(b)

(f)

(c)

(g)

(d)

US 7,839,911 B2

SEMICONDUCTOR LASER DEVICE

RELATED APPLICATIONS

This application is the U.S. National Phase under 35 U.S.C. §371 of International Application No. PCT/JP2007/062274, filed on Jun. 19, 2007, which in turn claims the benefit of Japanese Application No. 2006-196821, filed on Jul. 19, 2006, the disclosures of which Applications are incorporated by reference herein.

TECHNICAL FIELD

The present invention relates to a semiconductor laser device, and in particular to a technique for stabilizing a fundamental transverse mode oscillation when operating at a high output power.

BACKGROUND ART

A semiconductor laser device is an optical device necessary for an optical disc apparatus to write data onto optical discs, such as DVDs (Digital Versatile Disc) and CDs (Compact Disc).

In recent years, the optical disc apparatus has been required to increase the writing speed. In order to increase in speed, semiconductor lasers need to have a higher output.

FIG. 9 is a cross-sectional view showing the structure of a conventional high-power semiconductor laser device 20 disclosed in Patent Document 1.

The semiconductor laser device 20 is formed on an n-type GaAs substrate 10. On the substrate 10, an n-type GaAs buffer layer 11, an n-type AlGaInP first clad layer 12, an AlGaInP active layer 13, a p-type AlGaInP second clad layer 14, a p-type GaInP protective layer 15 are laminated in sequence.

In this way, the semiconductor laser device 20 has a double-hetero structure in which the active layer 13 is sandwiched between the clad layers 12 and 14 that each have a larger energy band gap than the active layer 13.

Also, as shown in FIG. 9, the p-type AlGaInP second clad layer 14 forms, on the active layer 13, a protruding layer whose upper surface is flat. Furthermore, the ridge is partly covered with an n-type AlGaInP current block layer 16 in a manner that the upper surface of the protrusion is exposed. Also, a p-type GaAs contact layer 17 is laminated so as to cover the n-type AlGaInP current block layer 16 and the p-type GaInP protective layer 15 that is positioned on the upper surface of the protrusion.

To improve the light extraction efficiency of the high-output semiconductor laser device 20, a front cleavage plane of a resonator is coated such that the reflectivity thereof is approximately in a range of 5 to 10%, and a rear cleavage plane of the resonator is coated such that the reflectivity thereof is approximately in a range of 95 to 100%.

Therefore, in terms of the spectral distribution intensity generated in the semiconductor laser device 20, the front cleavage plane and the rear cleavage plane are asymmetric. In other words, the spectral distribution intensity in the vicinity of the front cleavage plane is approximately twice as high as the spectral distribution intensity in the vicinity of the rear cleavage plane. As a result, a region in the vicinity of the front cleavage plane, whose optical density is higher, needs more light amplified by stimulated emission (hereinafter referred to as "stimulated emission light") than a region in the vicinity of the rear cleavage plane, whose optical density is lower. Therefore, the active layer 13 in the region in the vicinity of the front cleavage plane needs more pairs of electron and positive hole (hereinafter the pairs are referred to as "carriers") than the active layer 13 in the region in the vicinity of the rear cleavage plane, so as to cause more stimulated emission light to be generated.

Therefore, in the semiconductor laser device 20, the width (equivalent to the width of the p-type GaInP protective layer 15) of the upper surface of the ridge (protrusion) is formed so as to be smaller linearly from the front cleavage plane to the rear cleavage plane, in a direction of the resonator where the ridge extends (in an orthogonal direction with respect to the paper surface of FIG. 9), as shown in FIG. 10.

Specifically, the upper surface of the ridge, in a region from the front cleavage plane to the rear cleavage plane, is in the shape of an inverted trapezoid.

The above-described structure makes it possible to inject a greater number of carriers into the active layer 13 in the region in the vicinity of the front cleavage plane, and that has a higher optical density. Therefore, gain saturation is not easily caused even at a high output power, thereby achieving a high thermal saturation level. At the same time, a portion where the width of the upper surface of the ridge is narrow suppresses a high order traverse mode oscillation, resulting in preventing a kink from occurring.

Patent Document 1: Japanese Laid-Open Patent Application No. 2005-209952

DISCLOSURE OF THE INVENTION

The Problems the Invention is Going to Solve

In the invention disclosed in the Patent Document 1, the width of the upper surface of the ridge is adjusted to correct the bias of the spectral distribution intensity in the semiconductor laser device 20. The adjustment is performed in a manner that decides a position where the width of the upper surface of the ridge is to be the smallest, with respect to the direction of the resonator. However, there is no restriction on the width of the upper surface of the ridge on the side of the front cleavage plane. This causes a problem when, for example, the difference between (i) the width of the upper surface of the ridge on the side of the front cleavage plane and (ii) the width of the upper surface on the side of the ridge at the rear cleavage plane is large. In this case, the radiation loss of laser light created in a traverse mode increases. Then, the amount of laser light extractable from the front cleavage plane decreases, as compared to the amount of carriers injected, resulting in lowering the thermal saturation level.

In view of the above described problem, the object of the present invention is to provide a semiconductor laser device that performs a stable fundamental traverse mode oscillation, by preventing a decrease in the thermal saturation level of laser light output when operating at a high output power.

Means to Solve the Problems

In order to achieve the above-described problem, the present invention provides a semiconductor laser device having a ridge stripe structure, comprising: a clad layer having a protrusion that extends from a front cleavage plane to a rear cleavage plane, and that is included in the ridge stripe structure; and a current block layer covering the clad layer, except an upper surface of the protrusion, wherein a width W of the upper surface of the protrusion is nonuniform between the front cleavage plane and the rear cleavage plane, when (i) Wf denotes a width of the upper surface at the front cleavage plane, (ii) Wr denotes a width of the upper surface at the rear cleavage plane, (iii) L denotes a distance between the front cleavage plane and the rear cleavage plane, and (iv) Sc denotes an area of the upper surface, in a distance range where a distance from the front cleavage plane is shorter than or equal to L/2, Wf>Wr, L/8×(3Wf+Wr)<Sc≦L/2×Wf, and ½(Wf+Wr)<W≦Wf in an arbitrary position within the distance range.

In the above-described structure, W may gradually decrease toward the rear cleavage plane, in a distance range where the distance from the front cleavage is longer than L/2 and shorter than L.

In the above-described structure, Wf may be in a range of 2.5 μm to 6 μm inclusive, but preferably in a range of 3.0 μm to 4.8 μm inclusive. Also, Wr may be in a range of 0.8 μm to 2.5 μm inclusive, but preferably in a range of 1.5 μm to 2.2 μm inclusive.

Furthermore, in the above-described structure, a taper angle formed in a distance range, that starts from an arbitrary position X in a range where a distance D from the front cleavage plane is in a range of 0.45L≦D≦0.55L, and that ends in a position of the rear cleavage plane, may be larger than a taper angle formed in a distance range that starts from a position of the front cleavage plane and ends in the position X.

Also, when α denotes the taper angle formed in the distance range from the position X to the position of the rear cleavage plane, and β denotes the taper angle formed in the distance range from the position of the front cleavage plane to the position X, α may be in a range of 0.27°≦α≦0.37°, and β may be in a range of 0.01°≦β≦0.1°.

Furthermore, in the above-described structure, W may be equal to Wr, in a distance range where a distance from the rear cleavage plane is equal to or shorter than 50 μm.

Effects of the Invention

In the present invention with the stated structure, the width of the upper surface of the protrusion in the clad layer on the side of the front cleavage plane is formed to be larger than the width thereof on the side of the rear cleavage plane. In this way, a greater number of carriers are supplied for the region positioned in the front part of the resonator. Therefore, in a high-output semiconductor laser device, it is possible to effectively prevent the thermal saturation of light output caused by the carrier shortage, in a region where the spectral distribution intensity is high.

Furthermore, in the region on the side of the front cleavage plane, the width of the upper surface of the protrusion is formed in a manner that part of the width does not significantly become smaller. Therefore, the waveguide loss of the emitted light is reduced, thereby improving the efficiency of extracting light from the front cleavage plane with respect to the injection volume of carriers.

Also, a path of injection current is broaden so as to suppress the resistance in the path. Therefore, the operating voltage of the semiconductor laser device can be effectively reduced.

Furthermore, in the above-described structure, W may gradually decrease toward the rear cleavage plane, in a distance range where the distance from the front cleavage is longer than L/2 and shorter than L.

With the above-described structure, the width of the upper surface of the protrusion gradually decreases toward the rear cleavage plane where the spectral distribution intensity is smaller. Therefore, it is possible to prevent from the high-order transverse mode from occurring on the side of the rear cleavage plane. It is also possible to prevent a drop of a kink level (a light output level in which a linearity of current vs. light output characteristics cannot be maintained) caused by the high-order transverse mode.

In the above-described structure, W may gradually decrease in a direction moving away from the front cleavage plane, in the distance range where the distance from the front cleavage plane is shorter than or equal to L/2.

With the above-described structure, the width of the upper surface of the protrusion gradually decreases, in accordance with the change of the spectral distribution intensity in the region on the side of the front cleavage plane. Therefore, it is possible to prevent from the high-order transverse mode from occurring on the side of the front cleavage plane. It is also possible to prevent a drop of the kink level caused by the high-order transverse mode.

In the above-described structure, the current block layer may have been formed with a dielectric whose refractivity is smaller than 3.2.

With the above-described structure, the refractivity of a current block layer can be smaller than a refractivity of AlGaInP (3.2-3.6) used for a conventional current block layer, thereby improving the light-trapping effect.

Furthermore, W may be equal to Wf, in a distance range where the distance D from the front cleavage plane is in a range of 0.25L≦D≦0.35L, and may gradually decrease in a direction moving away from the front cleavage plane in a distance range where the distance D is beyond the distance range.

Also, a taper angle formed in a distance range, that starts from an arbitrary position Y in a range where the distance D is in a range of 0.65L≦D≦0.75L, and that ends in a position of the rear cleavage plane, may be larger than a taper angle formed in a distance range from a position where W starts decreasing to the position Y.

Furthermore, when α denotes the taper angle formed in the distance range from the position Y to the position of the rear cleavage plane, and β denotes the taper angle formed in the range from the position in which W starts decreasing to the position Y, α may be in a range of 0.27°≦α≦0.37°, and β may be in a range of 0.01°≦β≦0.1°.

The above-described structure (i) prevents the high-order transverse mode from occurring on the side of the front cleavage plane, and prevents a drop of the kink level caused by the high-order transverse mode, and also (ii) prevents the high-order transverse mode from occurring on the side of the rear cleavage plane, and prevents a drop of the kink level caused by the high-order transverse mode.

DESCRIPTION OF CHARACTERS

| | |
|---|---|
| 10, 101 | n-type GaAs substrate |
| 11, 102 | n-type GaAs buffer layer |
| 12, 103 | n-type AlGaInP first clad layer |
| 13, 104 | AlGaInP active layer |
| 14, 105 | p-type AlGaInP second clad layer |
| 15, 106 | p-type GaInP protective layer |
| 16, 107 | n-type AlGaInP current block layer |
| 17, 108 | p-type GaAs contact layer |

Best Mode for Carrying Out the Invention

The following describes the best mode for carrying out the present invention, with reference to drawings.

First Embodiment

Construction

Figure 1:
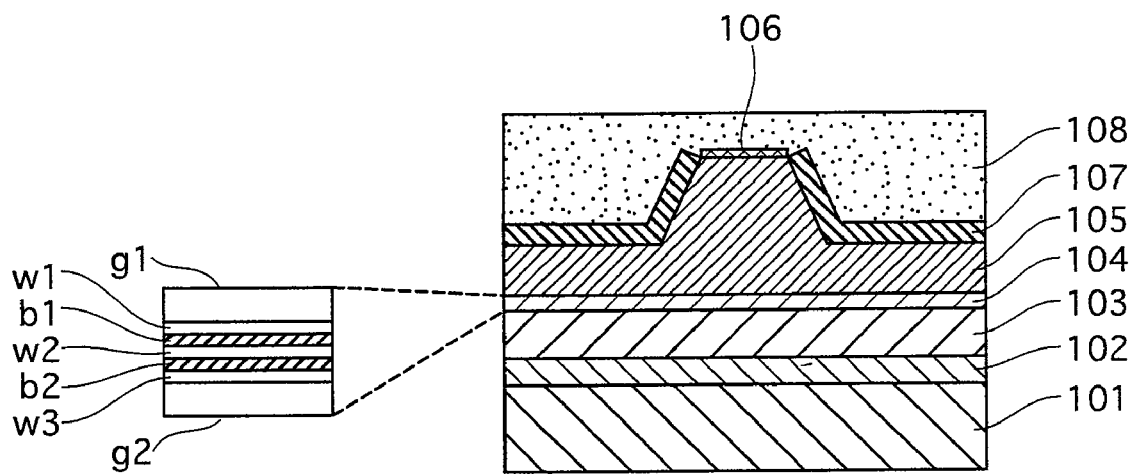
FIG. 1 is a cross-sectional diagram showing a structure of a semiconductor laser device 100.

FIG. 1 is a cross-sectional diagram showing a structure of a semiconductor laser device 100 in the first embodiment of the present invention.

The semiconductor laser device 100 includes an n-type GaAs buffer layer 102, an n-type AlGaInP first clad layer 103, an AlGaInP active layer 104, and a p-type AlGaInP second clad layer 105 that are laminated on an n-type GaAs substrate 101 in the stated order.

Note that although not shown in FIG. 1, an anodic electrode is provided on a below-described p-type GaAs contact layer 108, and a cathode electrode is provided under the n-type GaAs substrate 101.

The semiconductor laser device 100 constructed as described above has a double-hetero structure in which the AlGaInP active layer 104 is sandwiched between the n-type AlGaInP first clad layer 103 and the p-type AlGaInP second clad layer 105 that each have a large energy band gap.

As shown in the left diagram in FIG. 1, the AlGaInP active layer 104 is a strained quantum well active layer composed of an AlGaInP first guide layer g1, a GaInP first well layer w1, an AlGaInP first barrier layer b1, a GaInP second well layer w2, an AlGaInP second barrier layer b2, a GaInP third well layer w3, and an (AlGa) InP second guide layer g2.

Also, a protruding ridge whose upper surface is flat is formed in the p-type AlGaInP clad layer 105. Furthermore, the ridge is partly covered with an n-type AlGaInP current block layer 107 in a manner that the upper surface of the ridge is exposed.

Figure 2:
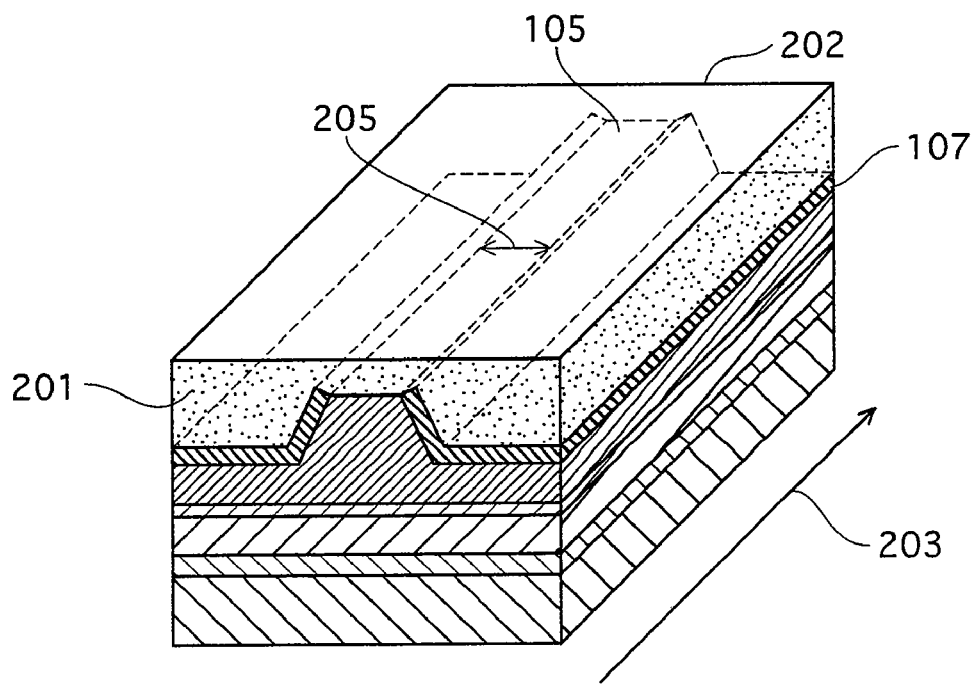
FIG. 2 is a perspective diagram showing an external view of a ridge of the semiconductor laser device 100.

As shown in FIG. 2, the ridge extends in an orthogonal direction with respect to the paper surface of FIG. 1, and is coated with a dielectric multilayer, so that the front cleavage plane 201 and the rear cleavage plane 202 of the resonator respectively have predetermined reflectivities (here, the reflectivity of the front cleavage plane 201 is 7%, and the reflectivity of the rear cleavage plane 202 is 95%). Note that the front cleavage plane 201 and the rear cleavage plane 202 are orthogonal with respect to the direction of the resonator (shown by the character 203 of FIG. 2) in which the ridge extends.

It is preferable that the reflectivity of the front cleavage plane 201 is approximately in a range of 5% to 10%, and the rear cleavage plane 202 is approximately in a range of 95% to 100%, to improve the light extraction efficiency.

In FIG. 2, the character 105 shows the p-type AlGaInP second clad layer 105 in FIG. 1, and the character 107 shows the n-type AlGaInP current block layer 107 in FIG. 1.

Also, the character 205 in FIG. 2 shows a width of the ridge (hereinafter referred to as "ridge width") in the shape of protrusion formed in the p-type AlGaInP second clad layer 105.

Figure 3:
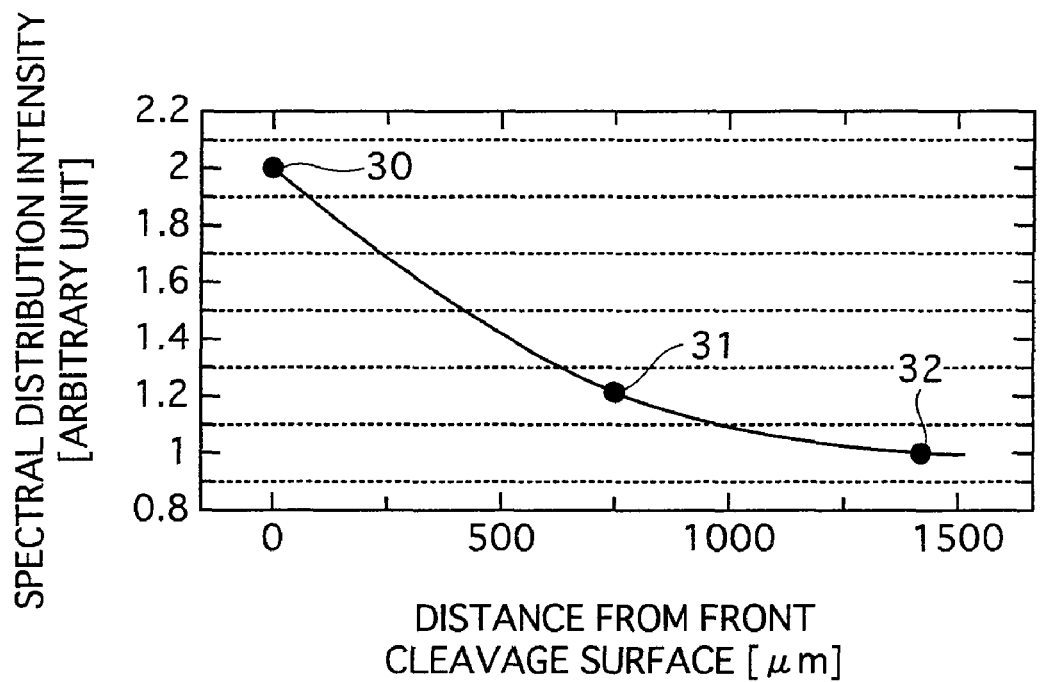
FIG. 3 shows a spectral distribution intensity of light generated by the semiconductor laser device 100, in a direction of a resonator.

FIG. 3 shows a spectral distribution intensity of light generated by the semiconductor laser device 100, in the direction of the resonator. In FIG. 3, the character 30 shows a position in the vicinity of the front cleavage plane 201 where the spectral distribution intensity is the highest, the character 32 shows a position in the vicinity of the rear cleavage plane 202 where the spectral distribution intensity is the lowest, and the character 31 shows a position equidistant from the front cleavage plane 201 and the rear cleavage plane 202. As shown in FIG. 3, the spectral distribution intensity demonstrates a propensity to gradually decrease in a direction from the front cleavage plane 201 to the rear cleavage plane 202. The spectral distribution intensity of the position 30 in the vicinity of the front cleavage plane 201 is approximately as twice as high as the position 32 in the vicinity of the rear cleavage plane 202.

Also, as shown in FIG. 1, a p-type GaInP protective layer 106 is laminated on the upper surface of the ridge formed in the p-type AlGaInP second clad layer 105. Furthermore, the p-type GaAs contact layer 108 is formed so as to cover the p-type GaInP protective layer 106 and the n-type AlGaInP current block layer 107.

In the semiconductor laser device 100, the current is injected from the p-type GaAs contact layer 108 via the electrodes, narrowed by the n-type AlGaInP current block layer 107, and injected intensely from the upper surface of the ridge to the AlGaInP active layer 104.

With the above-described structure, current of several tens of mA is injected. This makes it possible to realize a state of population inversion of carriers necessary for laser light oscillation.

In this case, light emitted by the recombination of carriers is trapped inside (i) by the n-type AlGaInP first clad layer 103 and the p-type AlGaInP second clad layer 105, with respect to a direction vertical to the main surface of the AlGaInP active layer 104, and (ii) by the n-type AlGaInP current block layer 107 whose refractivity is smaller than the p-type AlGaInP second clad layer 105, with respect to a direction parallel to the main surface of the AlGaInP active layer 104.

Figure 4:
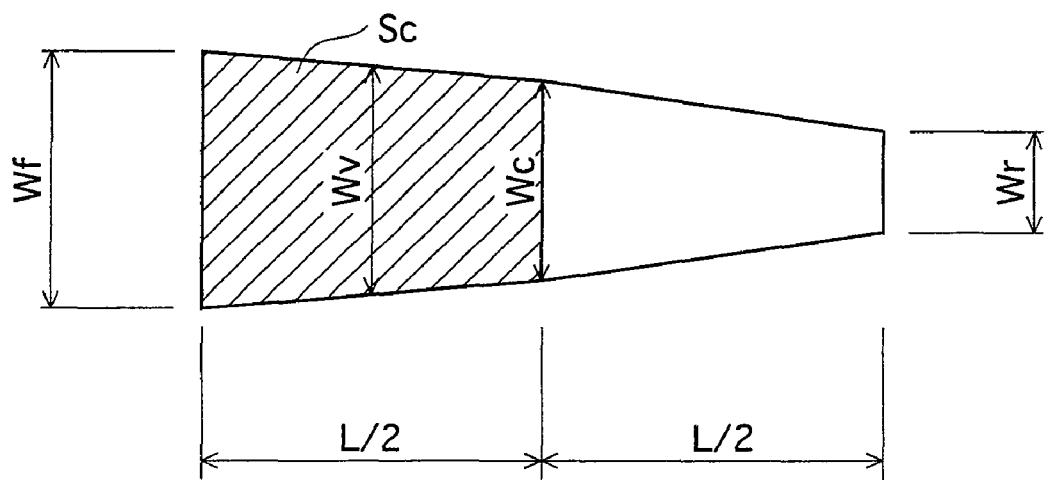
FIG. 4 shows distribution of a width of a ridge in the direction of the resonator shown by the character 203 in FIG. 2.

FIG. 4 shows distribution of the ridge width in the direction of the resonator shown by the character 203 of FIG. 2. Specifically, FIG. 4 shows a shape of the flat upper surface of the protruding ridge.

As shown in FIG. 4, the ridge width of the semiconductor laser device 100 varies, depending on a position of the ridge in the extending direction.

Wf denotes a ridge width of a position in which the ridge is orthogonal to the front cleavage plane 201 (hereinafter referred to as "front position"). Wr denotes a ridge width of a position in which the ridge is orthogonal to the rear cleavage plane 202 (hereinafter referred to as "rear position"). Wv denotes a ridge width of an arbitrary position between the front position and the rear position (hereinafter referred to as "varying position").

Wc denotes a ridge width of a position equidistant from the front position and the rear position, namely a position at a distance of L/2 from the front position when L is assumed to be a distance between the front position and the rear position (the distance is equivalent to the resonator length). Wc is set so as to be ½(Wf+Wr)<Wc≦Wf, and more preferably to be ½(Wf+Wr)+(Wf−Wr)/4<Wc<Wf. The area of the upper surface of the ridge within a distance from the front position to the position of L/2, which is shown as the character Sc in FIG. 4, is set so as to be L/8(3Wf+Wr)<Sc≦L/2×Wf.

Figure 10:
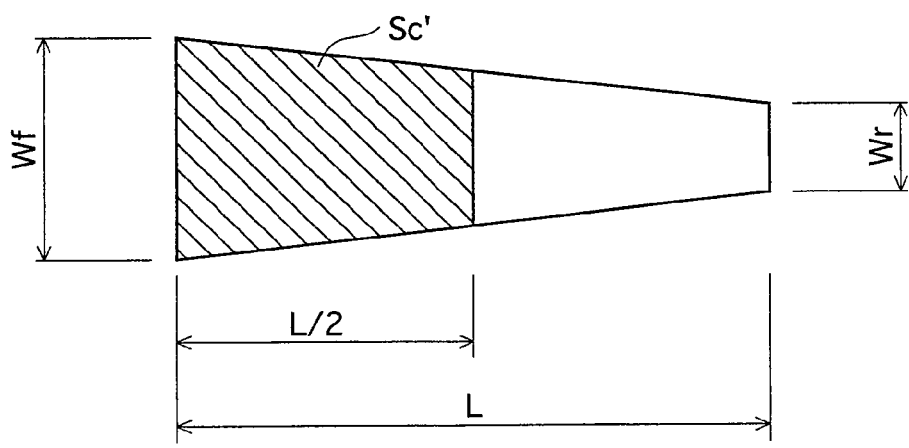
FIG. 10 shows distribution of a width of a ridge in a direction of a resonator of the semiconductor laser device 20.

Here, the left side of the above inequality of Sc corresponds to the area of the upper surface of the ridge within the distance from the front position to the position of L/2 (shown as Sc' in FIG. 10), in a case where the upper surface of the ridge is in the shape of an inverted trapezoid shown in FIG. 10.

Also, the right side of the above inequality of Sc shows the area of the upper surface of the ridge within the distance from the front position to the position of L/2, in a case where the ridge width Wf is fixed within the distance from the front position to the position of L/2.

Also, as shown in FIG. 4, Wv is set so as to gradually decrease in a direction from the front position to the rear position.

The amount of gradual decrease of Wv is optimized by the above setting.

With the above-described structure, in the semiconductor laser device 100 according to the present embodiment, the ridge width of the region on the side of the front cleavage plane 201 (specifically, the region within the distance from the front position to the position of L/2 shown by the character 31 in FIG. 3) is larger than the ridge width of the region on the side of the rear cleavage plane 202, so that more carriers are provided for the region on the side of the front cleavage plane 201 whose spectral distribution intensity is higher. Also, in the region on the side of the front cleavage plane 201 whose spectral distribution intensity is higher, the ridge width is designed so as not to become significantly small. This is to reduce the radiation loss of light propagating in the extending direction of the ridge. Therefore, in the region whose light distribution intensity is higher, it is possible to effectively prevent the thermal saturation of light output caused by a lack of carrier supply, and reduce the loss of the waveguide of light emitted by the recombination of carriers, by reducing a difference in ridge width. As a result, the efficiency of extracting light from the front cleavage plane 201, with respect to the injection volume of carriers, can be improved.

Furthermore, it is possible to broaden the path of injection current and thereby suppress the resistance in the path. Therefore, the operating voltage of the semiconductor laser device can be effectively reduced.

To achieve the above-described effect, Wf is preferably larger than or equal to 2.5 μm, and smaller than or equal to 6 μm, to suppress the occurrence of the high-order transverse mode.

Also, Wr is preferably smaller than or equal to 2.5 μm, to stabilize the transverse mode, and larger than or equal to 0.8 μm, to suppress the resistance in the path.

Furthermore, the thickness, composition, and relative proportion of each of the layers constituting the semiconductor laser device 100 can be arbitrarily set.

For example, the thickness of the n-type GaAs buffer layer 102 can be set to 0.5 μm, the relative proportion and the thickness of the n-type AlGaInP first clad layer 103 can be respectively set to $(Al_{0.7}Ga_{0.3})_{0.51}In_{0.49}P$ and 1.2 μm, the relative proportion and the thickness of the p-type AlGaInP second clad layer 105 can be respectively set to $(Al_{0.7}Ga_{0.3})_{0.51}In_{0.49}P$, and 0.2 (in the thinnest portion)-1.2 μm, the relative proportion and the thickness of the p-type GaInP protective layer 106 can be respectively set to $Ga_{0.51}In_{0.49}P$, and 50 nm, the relative proportion and the thickness of the n-type AlGaInP current block layer 107 can be respectively set to AlGaInP, and 0.7 μm, and the relative proportion and the thickness of the p-type GaAs contact layer 108 can be respectively set to GaAs, and 3 μm.

In the AlGaInP active layer 104, the relative proportion and the thickness of the first guide layer g1 can be respectively set to $(Al_{0.5}Ga_{0.5})_{0.51}In_{0.49}P$, and 50 nm, the relative proportion and the thickness of the first well layer w1 can be respectively set to $Ga_{0.48}In_{0.52}P$, and 5 nm, the relative proportion and the thickness of the first barrier layer b1 can be respectively set to $(Al_{0.5}Ga_{0.5})_{0.51}In_{0.49}P$, and 5 nm, the relative proportion and the thickness of the second well layer w2 can be respectively set to $Ga_{0.48}In_{0.52}P$, and 5 nm, the relative proportion and the thickness of the second barrier layer b2 can be respectively set to $(Al_{0.5}Ga_{0.5})_{0.51}In_{0.49}P$, and 5 nm, the relative proportion and the thickness of the third well layer w3 can be respectively set to $Ga_{0.48}In_{0.52}P$, and 5 nm, and the relative proportion and the thickness of the second guide layer g2 can be respectively set to $(Al_{0.5}Ga_{0.5})_{0.51}In_{0.49}P$, and 50 nm.

<Manufacturing Method>

Figure 5:
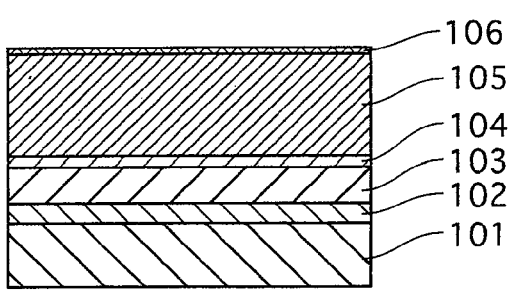
FIG. 5 shows a manufacturing process of the semiconductor laser device 100.
Figure 5:
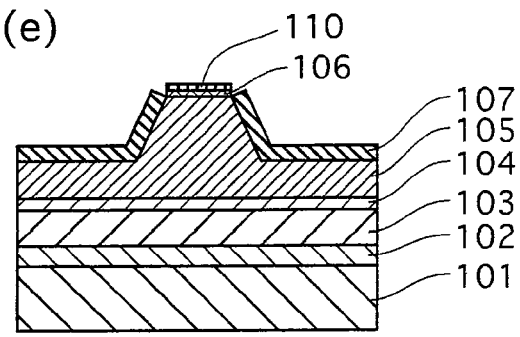
Figure 5:
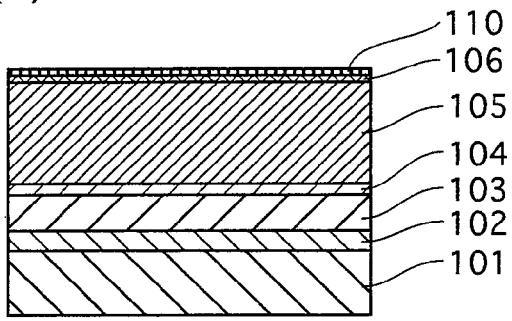
Figure 5:
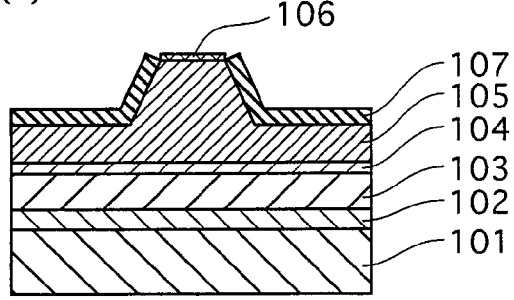
Figure 5:
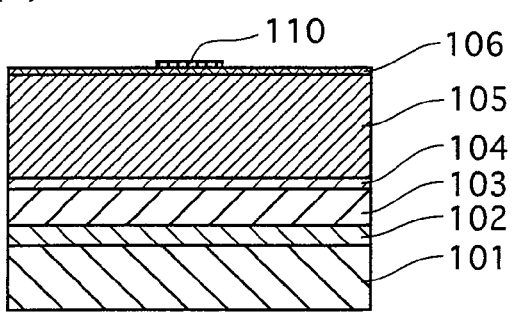
Figure 5:
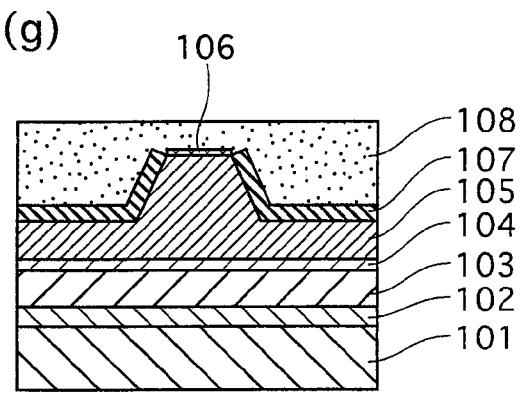
Figure 5:
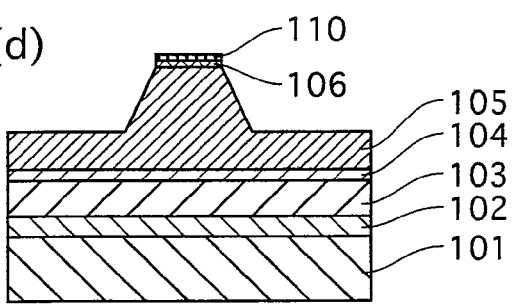

FIG. 5 shows a manufacturing process of the semiconductor laser device 100.

As shown in FIG. 5A, the n-type GaAs buffer layer 102, the n-type AlGaInP first clad layer 103, the AlGaInP active layer 104, the p-type AlGaInP second clad layer 105, and the p-type GaInP protective layer 106 are grown on the n-type GaAs substrate 101 in the stated order, with use of an epitaxial growth method. It is possible to use, for example, a molecular beam epitaxy (MBE), a metal-organic chemical vapor deposition method (MOCVD method), or a gas source MBE method, as the epitaxial growth method.

Then, as shown in FIG. 5B, a silicon oxide film 110 is formed on the p-type GaInP protective layer 106 that has been grown on top. The silicon oxide film 110 can be formed by, for example, a thermal chemical vapor deposition method (thermal CVD method).

A photoresist is applied on the silicon oxide film 110 that has been formed, in order to pattern the silicon oxide film 110 in a shape corresponding to the distribution pattern of the ridge shown in FIG. 4, with use of a photolithography method and a dry etching method. In this way, the silicon oxide film 110 is formed in a stripe shape, as shown in FIG. 5C. Furthermore, using the stripe-shaped silicon oxide film 110 as a mask, parts of the p-type GaInP protective layer 106 and the p-type AlGaInP second clad layer 105 that are in the vicinity of the silicon oxide film 110 are selectively etched and removed, so as to form a ridge in the shape of a protrusion, as shown in FIG. 5D.

Subsequently, the n-type AlGaInP current block layer 107 is selectively grown to be laminated on the p-type AlGaInP second clad layer 105, as shown in FIG. 5E. Here, the n-type AlGaInP current block layer 107 is grown with use of an epitaxial growth method, while the p-type GaInP protective layer 106 is masked. It is possible to use, for example, the MBE method, the MOCVD method, or the gas source MBE method, as the epitaxial growth method.

Then, as shown in FIG. 5F, the silicon oxide film 110, which has been used as a mask, is removed by etching.

Furthermore, as shown in FIG. 5G, the p-type GaAs contact layer 108 is grown to be laminated on the n-type AlGaInP current block layer 107 and the p-type GaInP protective layer 106, with use of the epitaxial growth method.

Second Embodiment

A semiconductor laser device 200 of the present invention is the same as the semiconductor laser device 100 of the first embodiment, except that a distribution pattern of the ridge width is different from the pattern shown in FIG. 4. Therefore, the following only describes the difference.

Figure 8:
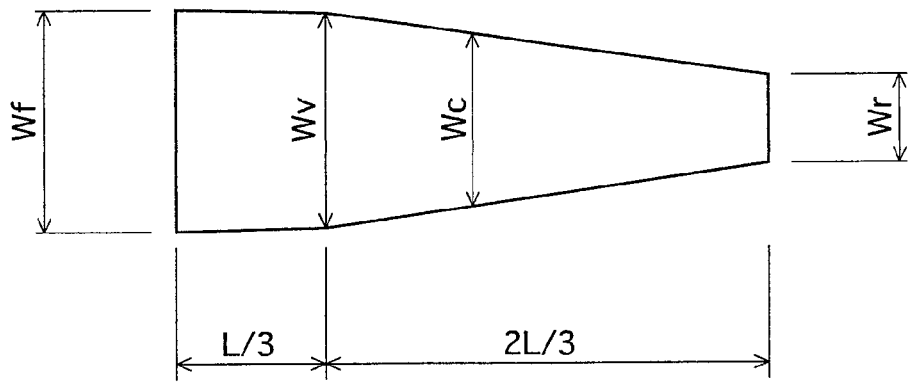
FIG. 8 shows distribution of a width of a ridge in a direction of a resonator in which the ridge extends, in a semiconductor laser device 200.
Figure 9:
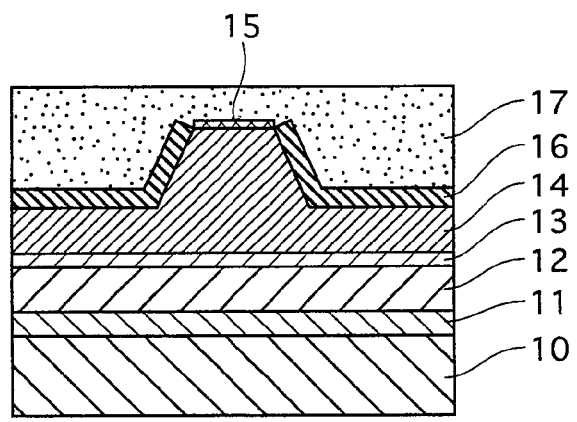
FIG. 9 is a cross-sectional diagram showing a structure of a conventional high-output semiconductor laser device 20 disclosed in Patent Document 1.

FIG. 8 shows distribution of the ridge width in the direction of the resonator in which the ridge extends, in the semiconductor laser device 200.

As shown in FIG. 8, Wv is set so as to be equal to Wf, within a distance from the front position to the position of L/3, and to be decreased gradually and linearly toward the rear position when going beyond the position of L/3.

The distance from the front position is not limited to L/3. It is acceptable as long as the distance is in a range of 0.25L-0.35L inclusive.

Also, "Wv is equal to Wf" as described above means that wv is equal to Wf with an error range of ±0.5%.

Third Embodiment

A semiconductor laser device 300 of the present embodiment is the same as the semiconductor laser device 100 of the first embodiment, except that a distribution pattern of the ridge width is different from the pattern shown in FIG. 4. Therefore, the following only describes the difference.

Figure 11:
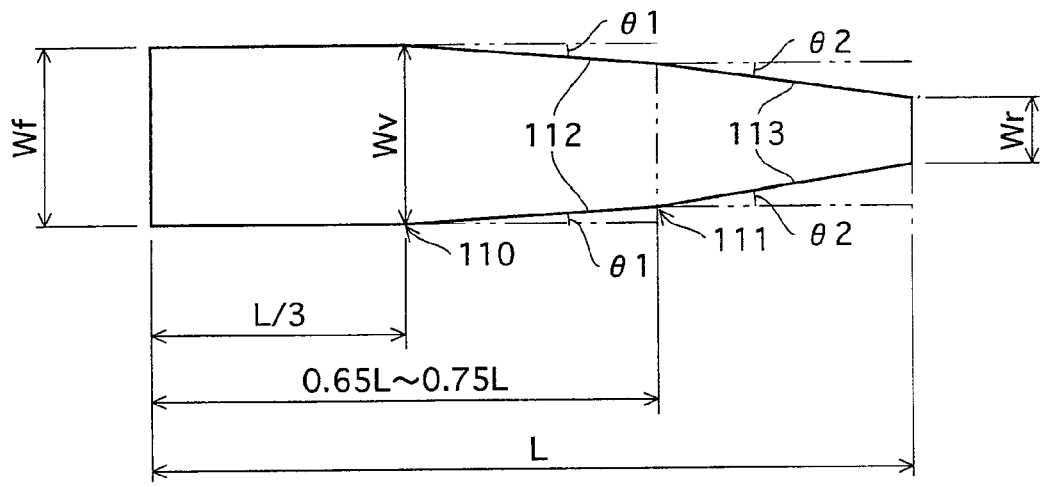
FIG. 11 shows distribution of a width of a ridge in a direction of a resonator in which the ridge extends, in a semiconductor laser device 300.

FIG. 11 shows the distribution of the ridge width in the direction of the resonator in which the ridge extends, in a semiconductor laser device 300. Specifically, FIG. 11 shows a shape formed by a flat upper surface of the ridge that is in the shape of a protrusion.

As shown in FIG. 11, Wv is set so as to be equal to Wf, within the distance from the front position to the position of L/3, and to be decreased gradually and linearly toward the rear position when going beyond the position of L/3.

The distance from the front position is not limited to L/3. It is acceptable as long as the distance is in a range of 0.25L-0.35L inclusive. This also applies to the position shown by the character 110 in FIG. 11, which is described below.

Furthermore, as shown in FIG. 11, a taper angle θ2 is set to be greater than a taper angle θ1 (θ2>θ1). Here, θ2 is a taper angle in a region of the upper surface, and is formed in a range (hereinafter referred to as "rear range") from an arbitrary position to the rear position. The arbitrary position is shown by the character 111 in FIG. 11, and is located between (i) a position shown by the character 110 in FIG. 11, which is L/3 away from the front position in the extending direction of the ridge and (ii) a position away from a predetermined distance (0.65L-0.75L). θ1 is a taper angle in a region of the upper surface, and is formed in a range that starts from the position shown by the character 110 and ends in the position shown by the character 111.

In the above-described case, it is preferable that θ1 is in a range of $0.01° \leq θ1 \leq 0.1°$, and θ2 is in a range of $0.27° \leq θ2 \leq 0.37°$.

Here, the "taper angle" refers to an angle formed between (i) the outline of the flat upper surface of the protruding ridge, in the extending direction, and (ii) the x axial direction of the Cartesian coordinate in FIG. 11 (for the taper angle in FIG. 12 described below, see FIG. 12). Here, the taper angles refer to (i) an angle formed by an outline in the front range, with respect to the x axial direction, and (ii) an angle formed by an outline in the rear range, with respect to the x axial direction (the outlines are shown by the characters 112 and 113 in FIG. 11). The taper angle with respect to the outline 112 is shown by θ1 in FIG. 11, and the taper angle with respect to the outline 113 is shown by θ2 in FIG. 11.

Example

1. Correlation Between Current-Light Output

In each of the semiconductor laser devices 100 and 200 of the first and second embodiments, and the conventional semiconductor laser device 20, the current-light output characteristics that indicate the correlation between current and light output were measured to make current-light output characteristic curves. The characteristics were measured in a pulse condition where the temperature of the pulse was 80° C., the width thereof was 50 ns, and a duty was 50%, with use of a current-light output (I-L) characteristic measuring device. The resonator length of each semiconductor lasers is 1500 μm, Wf thereof is 3.5 μm, and Wr thereof is 1.9 μm.

Figure 6:
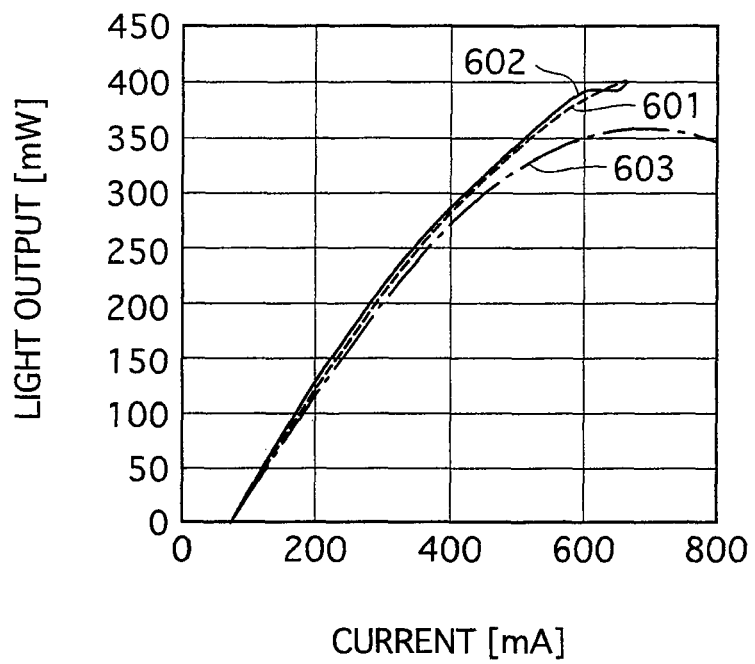
FIG. 6 shows linearity of current vs. light output characteristic curves.

FIG. 6 shows the current-light output characteristic curves that have been made. As shown in FIG. 6, the semiconductor laser devices 100 (shown by the character 601) and 200 (shown by the character 602) of the first and second embodiments exhibited excellent current-light output characteristic curves that had a high linearity, without kinks even when the light output was more than 350 mW. On the other hand, the current-light output characteristic curve of the conventional semiconductor laser device 20 (shown, by the character 603) exhibited a kink when the light output was around 320 mW.

2. Comparison of Operating Voltage

Figure 7:
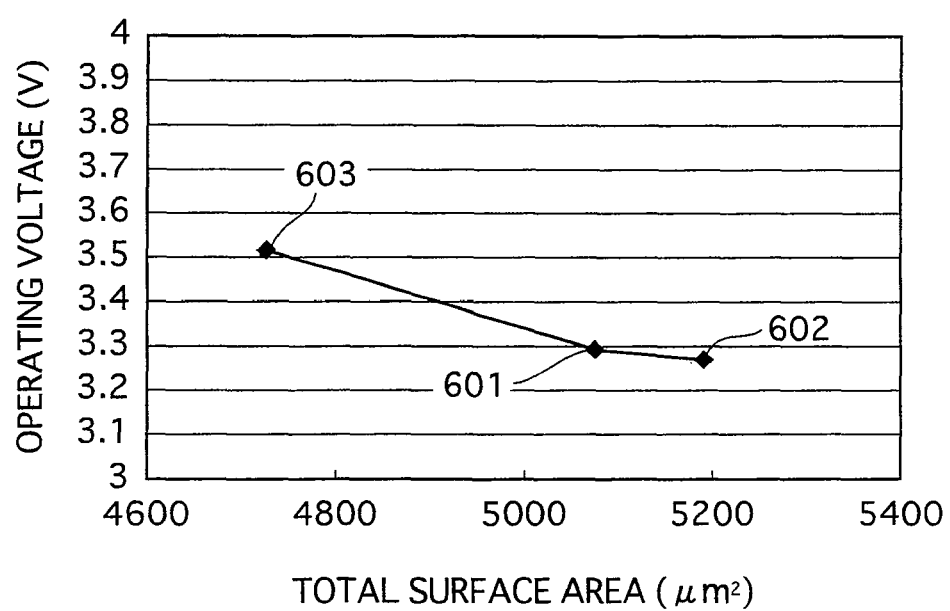
FIG. 7 shows a relationship between types of semiconductor laser devices and operating voltages.

FIG. 7 shows results of the measurement of the operating voltages of the semiconductor laser devices used in "1. Correlation between Current-Light Output". The measurement was performed with use of the I-L characteristic measuring device described in the item 1. The measurement was performed using the light output of 350 mW, under the same condition as the pulse condition in the item 1.

The vertical axis of the graph shown in FIG. 7 represents the operating voltage, and the horizontal axis of the graph represents the total surface area of the upper surface of the ridge in each semiconductor device.

As shown in FIG. 7, a negative correlation exists between the total surface area of the upper surface of the ridge and the operating voltage. Also, the more the total surface area of the upper surface of the ridge increases, the more the operating voltage tends to decrease.

In FIG. 7, the character 601 shows the semiconductor laser device 100, the character 602 shows the semiconductor laser device 200, and the character 603 shows the conventional semiconductor laser device 20.

As compared to the conventional semiconductor laser device 20, the semiconductor laser devices 100 and 200 in the first and second embodiments each have a large total surface area in the upper surface of the ridge and a significantly low operating voltage.

(Supplemental Remarks)

Although the present invention has been described by way of the above embodiments, it is obvious that the present invention is not limited to the above. For example, the following modifications are applicable.

(1) In the first embodiment, the change of the ridge width is optimized by limiting the range of Wc. However, the change of the ridge width may be optimized by further limiting the relationship between the taper angles in predetermined positions, as shown in FIG. 12.

Figure 12:
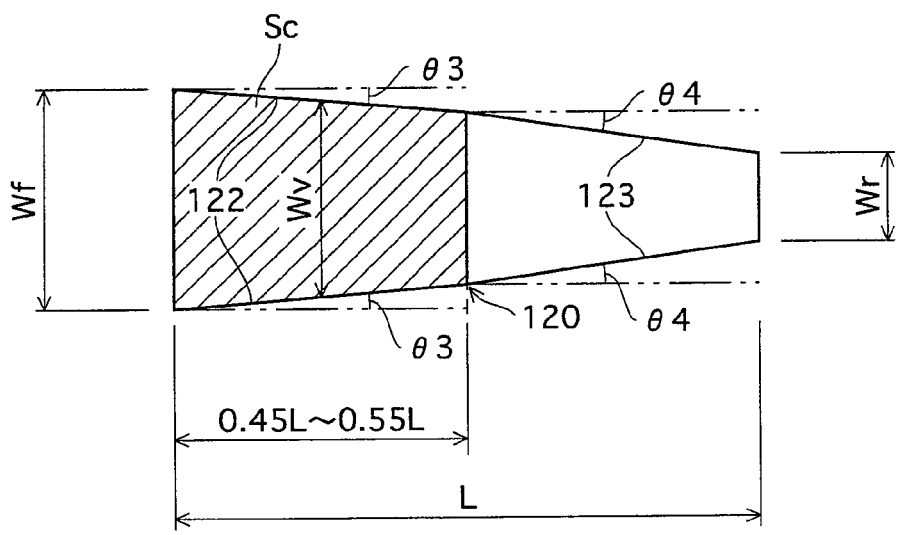
FIG. 12 shows a modification of FIG. 4.

Specifically, as shown in FIG. 12, a taper angle θ4 with respect to an outline 123 may be set to be greater than a taper angle θ3 with respect to an outline 122 (θ4>θ3). Here, the taper angle θ4 is formed in a range that starts from an arbitrary position (shown by the character 120 in FIG. 12) within a predetermined distance (0.45L-0.55L) from the front position in the extending direction of the ridge, and ends in the rear position. The taper angle θ3 is formed in a range that starts from the front position and ends in the position shown by the character 120.

In the above-described case, it is preferable that θ3 is in a range of $0.01° \leq θ3 \leq 0.1°$, and θ4 is in a range of $0.27° \leq θ4 \leq 0.37°$.

With the stated structure, the same effect as when a range of Wc is limited can be obtained.

(2) In the first and second embodiments of the present invention, the n-type AlGaInP is used as the current block layer 107. However, it is possible to use a dielectric material whose refractivity is smaller than a refractivity of AlGaInP (3.2-3.6), as a current block layer. For example, $SiO_2$ (Refractivity: 1.5) or SiN (Refractivity: 2.0) can be used. A current block layer made of the dielectric material can be formed with use of, for example, an atmospheric pressure thermal CVD method.

The stated structure improves the light-trapping effect by reducing the refractivity of the current block layer.

(3) In the present embodiments, the shape of the cross section of the ridge formed in the p-type AlGaInP second clad layer 105 is trapezoid, but the shape is not limited to such. For example, the shape may be rectangular or square.

(4) In the first and second embodiments, the ridge shape of the present invention is applied to a red semiconductor laser using an AlGaInP compound semiconductor. However, it is not limited to such. The ridge shape of the present invention may also be applied to a blue semiconductor laser using a GaN compound semiconductor.

(5) The ridge shape of the present invention may be applied to a dual-wavelength semiconductor laser device. In this case, the ridge shape corresponds to each of the wavelengths.

For example, it is possible to form, on a common n-type GaAs substrate, (i) a semiconductor device for a first wavelength and (ii) a semiconductor device for a second wavelength that both have the same stripe structure as the semiconductor laser device 100.

(6) A resonator length applicable to the first, second, and third embodiments is not limited to a length in the range of approximately 1500 μm (1450 μm-1550 μm). It is applicable as long as the resonator length is at least 800 μm or longer.

For example, the resonator length may be approximately 1700 μm (1650 μm-1750), or may also be approximately 2200 μm (2150 μm-2250 μm).

(7) Wv of the semiconductor laser devices in the first, second, and third embodiments is set so as to be decreased gradually and linearly toward the rear position when exceeding a predetermined distance from the front position. However, Wv does not need to be gradually decreased, as long as Wv is within a range where a distance to the rear position is within 50 μm. Instead, Wv may be fixed to Wf.

INDUSTRIAL APPLICABILITY

The present invention relates to a semiconductor laser device, and in particular can be used as a technique for stabilizing a fundamental transverse mode oscillation when operating at a high output power.

The invention claimed is:

1. A semiconductor laser device having a ridge stripe structure, comprising:
   a clad layer having a protrusion that extends from a front cleavage plane to a rear cleavage plane, and that is included in the ridge stripe structure; and
   a current block layer covering the clad layer, except an upper surface of the protrusion, wherein:
   a width W of the upper surface of the protrusion is nonuniform between the front cleavage plane and the rear cleavage plane,
   when (i) Wf denotes a width of the upper surface at the front cleavage plane, (ii) Wr denotes a width of the upper surface at the rear cleavage plane, (iii) L denotes a distance between the front cleavage plane and the rear cleavage plane, and (iv) Sc denotes an area of the upper surface, in a distance range where a distance from the front cleavage plane is shorter than or equal to L/2,
   Wf>Wr,
   $L/8 \times (3Wf+Wr) < Sc \leq 0.12 \times Wf$, and
   $½ (Wf+Wr) < W \leq Wf$ in an arbitrary position within the distance range,
   a taper angle formed in a distance range, that starts from an arbitrary position X in a range where a distance D from the front cleavage plane is in a range of $0.45 \leq L \leq 0.55L$, and that ends in a position of the rear cleavage plane, is larger than a taper angle formed in a distance range that starts from a position of the front cleavage plane and ends in the position X, and
   when α denotes the taper angle formed in the distance range from the position X to the position of the rear cleavage plane, and β denotes the taper angle formed in the distance range from the position of the front cleavage plane to the position X,
   α is in a range of $0.27° \leq α \leq 0.37°$, and
   β is in a range of $0.01° \leq β \leq 0.1°$.

2. A semiconductor laser device having a ridge stripe structure, comprising:
   a clad layer having a protrusion that extends from a front cleavage plane to a rear cleavage plane, and that is included in the ridge stripe structure; and
   a current block layer covering the clad layer, except an upper surface of the protrusion, wherein:
   a width W of the upper surface of the protrusion is nonuniform between the front cleavage plane and the rear cleavage plane,
   when (i) Wf denotes a width of the upper surface at the front cleavage plane, (ii) Wr denotes a width of the upper surface at the rear cleavage plane, (iii) L denotes a distance between the front cleavage plane and the rear cleavage plane, and (iv) Sc denotes an area of the upper surface, in a distance range where a distance from the front cleavage plane is shorter than or equal to L/2,
   Wf>Wr,
   $L/8 \times (3Wf+Wr) < Sc \leq L/2 \times Wf$, and
   $½(Wf+Wr) < W \leq Wf$ in an arbitrary position within the distance range, W gradually decreases toward the rear cleavage plane, in a distance range where the distance from the front cleavage is longer than L/2 and shorter than L, W is equal to Wf, in a distance range where the distance D from the front cleavage plane is in a range of $0.25 \leq D \leq 0.35L$, and gradually decreases in a direction moving away from the front cleavage plane in a distance range where the distance D is beyond the distance range, a taper angle formed in a distance range, that starts from an arbitrary position Y in a range where the distance D is in a range of $0.65 \leq D \leq 0.75L$, and that ends in a position of the rear cleavage plane, is larger than a taper angle formed in a distance range from a position where W starts decreasing to the position Y, and when $\alpha$ denotes the taper angle formed in the distance range from the position Y to the position of the rear cleavage plane, and $\beta$ denotes the taper angle formed in the range from the position in which W starts decreasing to the position Y, $\alpha$ is in a range of $0.27° \leq \alpha \leq 0.37°$, and $\beta$ is in a range of $0.01° \leq \beta \leq 0.1°$.

* * * * *